US012772602B2

(12) United States Patent
Tao et al.

(10) Patent No.: US 12,772,602 B2
(45) Date of Patent: Oct. 20, 2026

(54) BACK CONTACT CELL AND PHOTOVOLTAIC MODULE

(71) Applicants: JINKO SOLAR CO., LTD., Jiangxi (CN); JINKO SOLAR (HAINING) CO., LTD., Haining City (CN)

(72) Inventors: Wusong Tao, Jiangxi (CN); Tao Xu, Jiangxi (CN); Luchuang Wang, Jiangxi (CN)

(73) Assignees: JINKO SOLAR CO., LTD., Jiangxi (CN); JINKO SOLAR (HAINING) CO., LTD., Zhejiang (CN)

( * ) Notice: Subject to any disclaimer, the term of this patent is extended or adjusted under 35 U.S.C. 154(b) by 0 days.

(21) Appl. No.: 19/195,677

(22) Filed: Apr. 30, 2025

(65) Prior Publication Data

US 2026/0164844 A1 Jun. 11, 2026

(30) Foreign Application Priority Data

Dec. 11, 2024 (CN) ......................... 202411824151.9

(51) Int. Cl.
*H10F 77/20* (2025.01)
*H10F 19/90* (2025.01)

(52) U.S. Cl.
CPC ......... *H10F 77/219* (2025.01); *H10F 19/908* (2025.01)

(58) Field of Classification Search
CPC ............................. H10F 77/219; H10F 19/908
See application file for complete search history.

(56) References Cited

FOREIGN PATENT DOCUMENTS

| | | | |
|---|---|---|---|
| CN | 115148839 | A | 10/2022 |
| CN | 115579407 | A | 1/2023 |
| CN | 115579407 | B | 3/2023 |
| CN | 116913992 | A | 10/2023 |
| CN | 220065714 | U | 11/2023 |
| CN | 220774388 | U | 4/2024 |
| CN | 118073439 | A | 5/2024 |
| CN | 118431305 | A | 8/2024 |
| EP | 4386866 | A1 | 6/2024 |
| WO | 2014040834 | A2 | 3/2014 |
| WO | 2024146054 | A1 | 7/2024 |
| WO | 2024240136 | A1 | 11/2024 |

OTHER PUBLICATIONS

Jinko Solar Co., Ltd et al., European Search Report, EP25173391.1, Oct. 15, 2025, 9 pgs.

*Primary Examiner* — Tae-Sik Kang
(74) *Attorney, Agent, or Firm* — USCH Law, PC

(57) ABSTRACT

A back contact cell includes: a cell base having a first edge; first finger electrodes and second finger electrodes, first connection electrodes and second connection electrodes, and a connection structure. The first connection electrodes include an edge connection electrode adjacent to the first edge, and no soldering portion is provided on the edge connection electrode. A second connection electrode immediately adjacent to the first edge includes separate collection portions, where at least one collection portion is connected to one or more respective second finger electrodes of the second finger electrodes. The connection structure is connected at one end to the edge connection electrode, extends through a space between two adjacent collection portions of the second connection electrode immediately adjacent to the edge connection electrode, and is connected at another end to one of the first connection electrodes adjacent to the edge connection electrode.

20 Claims, 5 Drawing Sheets

BACK CONTACT CELL AND PHOTOVOLTAIC MODULE

CROSS REFERENCE TO RELATED APPLICATIONS

The present application claims the benefit of priority under the Paris Convention to Chinese Patent Application No. 202411824151.9 filed on Dec. 11, 2024, which is incorporated herein by reference in its entirety.

TECHNICAL FIELD

Embodiments of the present disclosure relates to the technical field of photovoltaics, and in particular to back contact cell and a photovoltaic module.

BACKGROUND

Currently, as fossil fuels are gradually depleted, solar cells are becoming increasingly widely used as a new alternative energy source. Solar cells are devices that convert solar light energy into electrical energy. Solar cells generate carriers based on the photovoltaic effect, and then the carriers are led out using electrodes, thereby facilitating the efficient utilization of electrical energy.

The factors affecting the photoelectric conversion efficiency and yield rate of solar cells primarily include two aspects: optical losses and electrical losses. Optical losses include shading loss, carrier recombination loss in the substrate, carrier recombination loss in highly doped film layers, and refractive loss in film layers. Electrical losses include resistance loss of material itself, contact loss of electrodes, contact loss between solder ribbons and solar cells, and loss caused by incomplete solder between solder ribbons and solar cells.

Therefore, there is an urgent need in this field to provide a solar cell and a photovoltaic module that can reduce electrical and optical losses, thereby improving the photoelectric conversion efficiency of the corresponding solar cell and the yield rate of the photovoltaic module.

SUMMARY

A back contact cell, includes: a cell base having a first edge; first finger electrodes and second finger electrodes alternatingly arranged along a first direction; first connection electrodes and second connection electrodes alternatingly arranged along a second direction; and a connection structure. The first connection electrodes are connected to the first finger electrodes, and the second connection electrodes are connected to the second finger electrodes. The first connection electrodes include an edge connection electrode adjacent to the first edge, and no soldering portion is provided on the edge connection electrode. A second connection electrode immediately adjacent to the first edge includes separate collection portions. At least one collection portion is connected to one or more respective second finger electrodes of the second finger electrodes. The connection structure is connected at one end to the edge connection electrode, extends through a space between two adjacent collection portions of the second connection electrode immediately adjacent to the edge connection electrode, and is connected at another end to one of the first connection electrodes adjacent to the edge connection electrode. At least one of the two adjacent collection portions includes a first portion adjacent to the connection structure and a second portion away from the connection structure, and the first portion is wider in the second direction than the second portion.

In some embodiments, a spacing d between the second finger electrode adjacent to the connection structure and the connection structure, and a length L of the first portion along the first direction satisfy: $d \leq L \leq 2d$.

In some embodiments, the length L of the first portion along the first direction ranges from 0.5 mm to 2 mm.

In some embodiments, the second finger electrodes include a second collection portion and a second confluence portion, the second confluence portion is connected to a respective one of the second connection electrodes, and the second confluence portion serves as a soldering portion of the second finger electrodes; the second confluence portion is wider in the first direction than the second collection portion.

In some embodiments, the cell further includes solder pads located at intersections of some of the second connection electrodes and the second finger electrodes.

In some embodiments, the number of the connection structures ranges from 5 to 24.

In some embodiments, the number of the second finger electrodes located between adjacent connection structures ranges from 6 to 12.

In some embodiments, a width of the first portion along the second direction ranges from 50 μm to 100 μm.

Some embodiments of the present disclosure further provide a photovoltaic module, including: at least one cell string, formed by connecting multiple back contact cells as described above; at least one encapsulation film, configured for covering the at least one cell string; and at least one cover plate, located on a side of the at least one encapsulation film away from the at least one cell string.

In some embodiments, the at least one cell string includes: back contact cells; solder ribbons, electrically connected to the second connection electrodes; and an insulating layer, located between the connection structure and the solder ribbons; wherein a top surface, away from the cell base, of the first portion of the second connection electrodes is flush with a top surface, away from the connection structure, of the insulating layer.

BRIEF DESCRIPTION OF THE DRAWINGS

One or more embodiments are illustrated through the figures in the corresponding drawings. These exemplary illustrations do not constitute limitations on the embodiments unless otherwise stated. The figures in the accompanying drawings do not constitute a scale limitation. In order to illustrate the technical solutions in embodiments of the present disclosure or in the conventional technology more clearly, the drawings used in the description of the embodiments are briefly described below. It is apparent that the drawings in the following description show only some embodiments of the present disclosure, and other drawings may be obtained by those of ordinary skill in the art based on these drawings without any creative efforts.

DETAILED DESCRIPTION OF THE EMBODIMENTS

Figure 1:
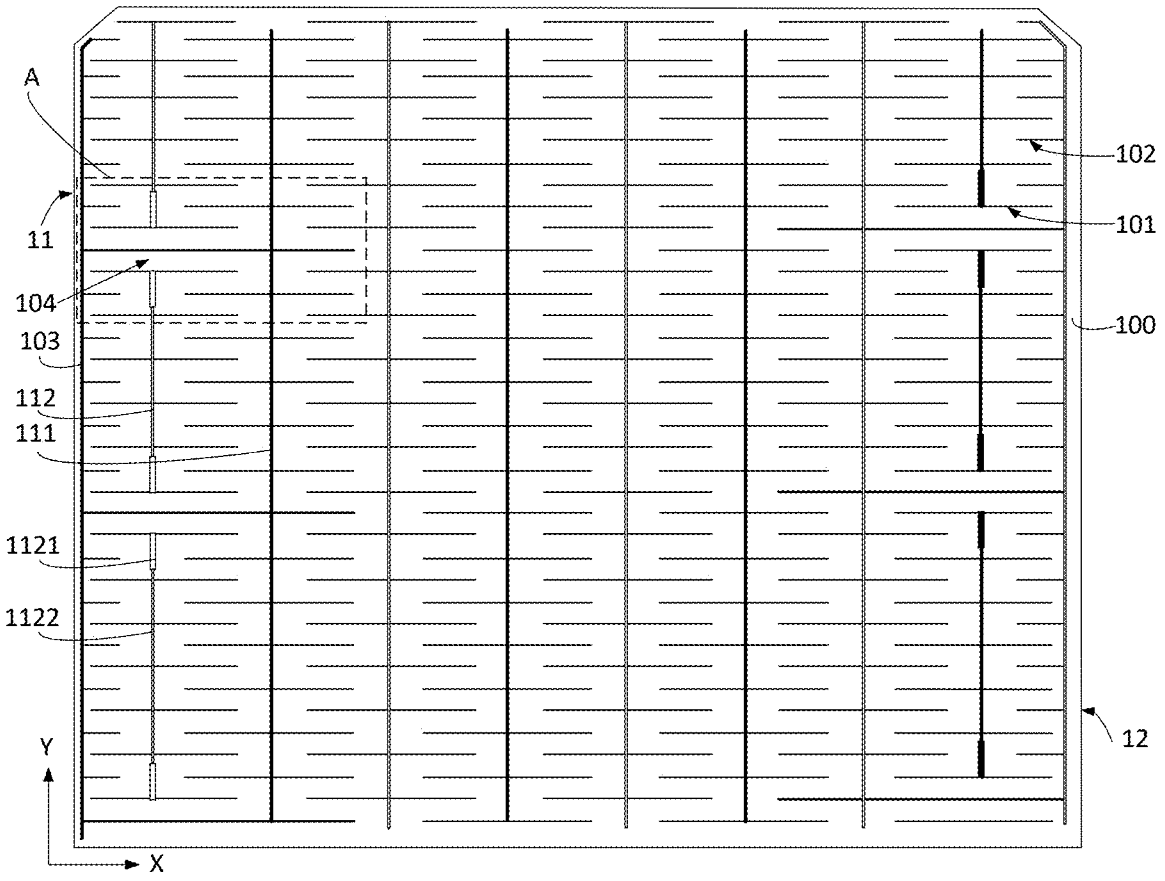
FIG. 1 is a schematic structural view of a back contact cell provided in an embodiment of the present disclosure.

As can be seen from the background technology, the yield rate of current photovoltaic modules is unsatisfactory.

Embodiments of the present disclosure provide a back contact cell and a photovoltaic module. As no soldering portion is provided on the edge connection electrode, the issue of cracking at the edges of the cell base can be avoided. Provision of a connection structure achieves the connection between the edge connection electrode and the connection electrodes of the same polarity, thereby enabling the collection of carriers in the edge region. Further, specifying the width of the second connection electrode corresponding to the connection structure to increase the solder area between the solder ribbon and the second connection electrode can improve the yield rate of photovoltaic modules.

In the description of the embodiments of the present disclosure, technical terms such as "first", "second", etc., are merely used for distinguishing different objects and should not be construed as indicating or implying relative importance or as implicitly specifying the number, specific order, or priority of the technical features referred to. In the description of the embodiments of the present disclosure, the term "plurality/plural/multiple" refers to two or more, unless otherwise explicitly specified.

The mention of "embodiment" in this paper means that the specific features, structures, or characteristics described in conjunction with the embodiments may be included in at least one embodiment of the present disclosure. The appearance of this phrase at various locations in the specification does not necessarily refer to the same embodiment, nor is it an independent or alternative embodiment that is exclusive with other embodiments. Those skilled in the art can understand explicitly and implicitly that the embodiments described in this paper can be combined with other embodiments.

In the description of the embodiments of the present disclosure, the term "and/or" merely describes the associative relationship between associated objects, indicating that there can be three types of relationships. For example, A and/or B can represent three possible situations: sole existence of A, existence of both A and B, and sole existence of B. Additionally, the character "/" in this paper generally indicates that the associated objects with this character are in an "or" relationship.

In the description of the embodiments of the present disclosure, the phase "multiple" or "plurality of" refers to two or more (including two). Similarly, "multiple groups" or "plurality of groups" refers to two or more groups (including two groups), and "multiple pieces" or "plurality of pieces" refers to two or more pieces (including two pieces).

In the description of the embodiments of the present disclosure, the technical terms "center", "longitudinal", "lateral", "length", "width", "thickness", "upper", "lower", "front", "rear", "left", "right", "vertical", "horizontal", "top", "bottom", "inner", "outer", "clockwise", "counter-clockwise", "axial", "radial", "circumferential", etc., indicate the orientation or positional relationship based on the orientation or positional relationship shown in the accompanying drawings. This is solely for the purpose of facilitating the description of the embodiments of the present disclosure and simplifying the description, and in no way indicate or imply that the devices or elements referred to must have a specific orientation, be constructed or operated in a specific orientation. Therefore, these terms should not be construed as a limitation on the embodiments of the present disclosure.

In the description of the embodiments of the present disclosure, unless otherwise explicitly specified and defined, the technical terms such as "installation", "connection", "fixation", etc. should be understood in a broad sense. For example, "connection" may refer to fixed connection, detachable connection, or integral connection; mechanical connection or electrical connection; direct connection, or indirect connection through an intermediary. It may further refer to the internal connectivity between two components or the interaction between two components. For those of ordinary skill in the art, the specific meanings of the above terms in embodiments of the present disclosure should be understood according to the specific circumstances.

In the drawings corresponding to the embodiments of the present disclosure, the thickness and area of the layers have been exaggerated for better understanding and ease of description. When a component (such as a layer, film, region, or substrate) is described as on another component or on the surface of another component, the component may be "directly" located on the surface of the another component, or a third component may exist between the two components. On the contrary, when one component is described as being at the surface of another component, or when it recites that one component's surface forms or is provided with another component, it indicates that there is no third component between the two components. In addition, when it recites that a component is "roughly" formed on another component, it means that this component is not formed on the entire surface (or front surface) of the another component, nor is it formed on a portion of the edge of the entire surface.

In the description of the embodiments of the present disclosure, when it recites that one component "includes" another component, it does not exclude other components and other components may also be further included unless otherwise stated. In addition, when a component such as a layer, film, region, or plate is referred to as being "on/located on" another component, it can either be "directly on" the another component (i.e., located on the surface of the another component without any other components in between), or yet another component may exist between them. In addition, when a component such as a layer, film, region, or plate is referred to as being "directly located on" another component, or when a component such as a layer, film, region, or plate is referred to as being located on the surface of another component, it indicates that no other components are located between them.

The terms used in the description of various embodiments mentioned in this paper are solely for the purpose of describing specific embodiments and are not intended to be restrictive. As used in the description of the various embodiments and the appended claims, "component" is also intended to cover the plural form, unless the context clearly indicates otherwise. Among them, components include layers, films, regions, or plates.

The following provides a detailed description of the various embodiments of the present disclosure in conjunction with the accompanying drawings. However, those of ordinary skill in the art may understand that in various embodiments of the present disclosure, many technical details have been presented to facilitate a better understanding of the present disclosure by the reader. However, even without these technical details and the various variations and modifications based on the following embodiments, the technical solution claimed in the present disclosure can still be achieved.

Some embodiments of the present disclosure provide a back contact cell.

Figure 2:
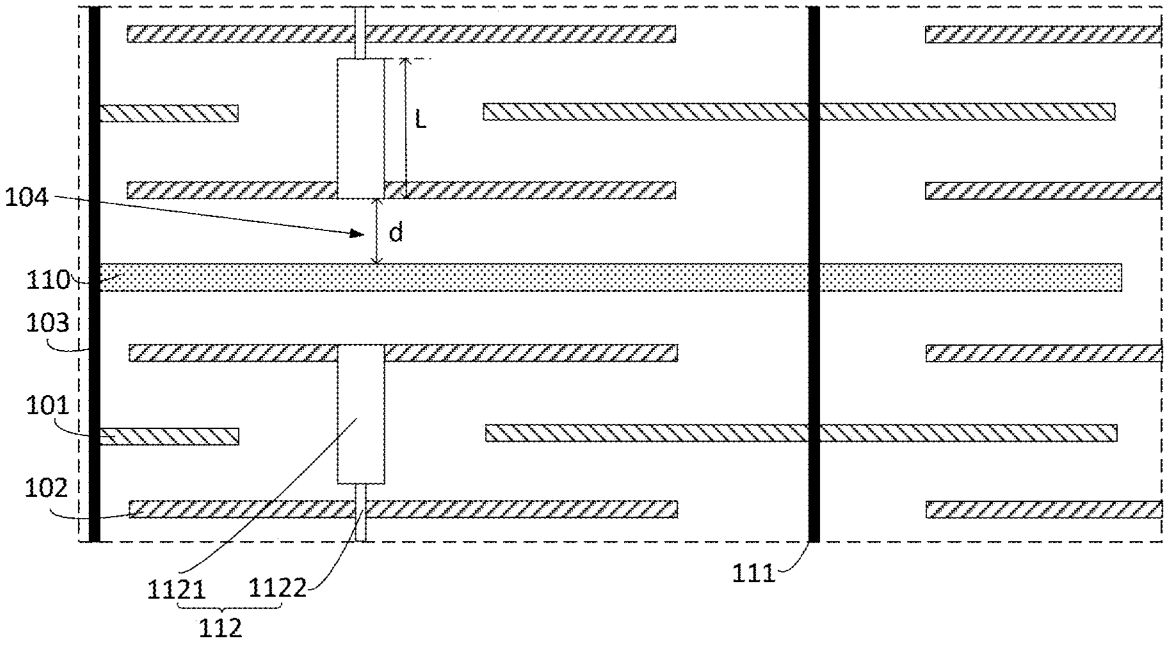
FIG. 2 is a partially enlarged view of portion A in FIG. 1.
Figure 3:
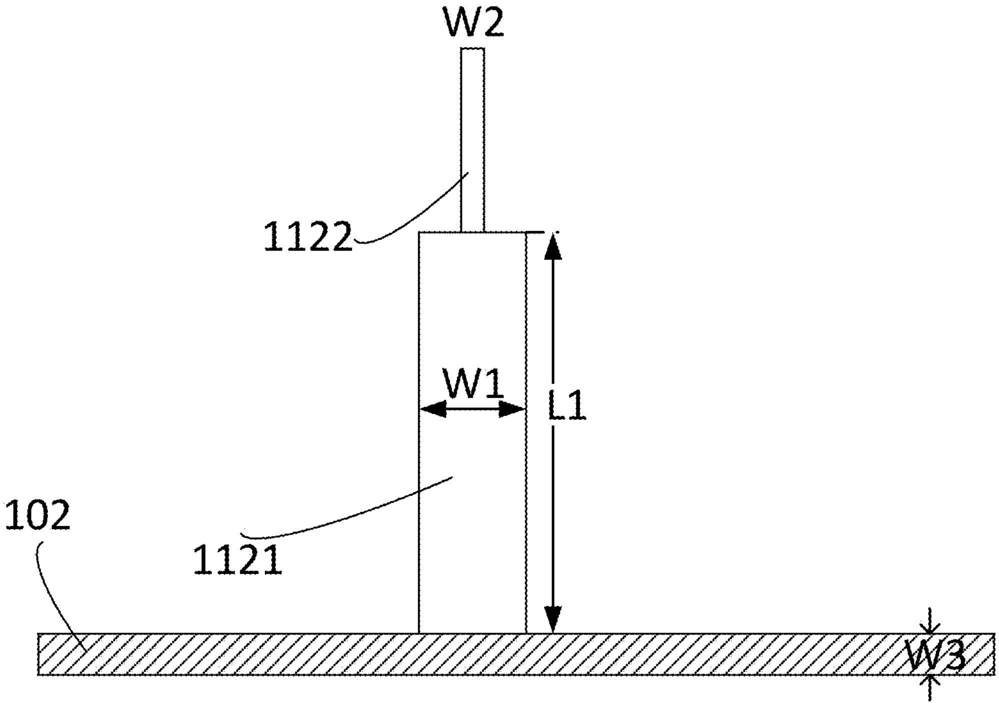
FIG. 3 is a schematic structural view of a collection portion of the back contact cell provided in an embodiment of the present disclosure.

FIG. 1 is a schematic structural view of a back contact cell provided in an embodiment of the present disclosure. FIG. 2 is a partially enlarged view of portion A in FIG. 1. FIG. 3 is a schematic structural view of a collection portion of the back contact cell provided in an embodiment of the present disclosure.

Referring to FIG. 1 and FIG. 2, the back contact cell includes: a cell base 100, having a first edge 11; first finger electrodes 101 and second finger electrodes 102 alternatingly arranged along a first direction Y; first connection electrodes 111 and second connection electrodes 112 alternatingly arranged along a second direction X, the first connection electrodes 111 being connected to the first finger electrodes 101, and the second connection electrodes 112 being connected to the second finger electrodes 102; where the first connection electrodes 111 include an edge connection electrode 103 adjacent to the first edge 11, and no soldering portion is provided on the edge connection electrode 103; a second connection electrode 112 immediately adjacent to the first edge 11 includes separate connection portions, where at least one collection portion is connected to one or more respective second finger electrodes 102 of the second finger electrodes 102; a connection structure 110, where the connection structure 110 is connected at one end to the edge connection electrode 103, extends through a space between two adjacent collection portions of the second connection electrode 112 immediately adjacent to the edge connection electrode 103, and is connected at another end to one of the first connection electrodes 111 adjacent to the edge connection electrode 103; where at least one of the two adjacent collection portions includes a first portion 1121 adjacent to the connection structure 110 and a second portion 1122 away from the connection structure 110, and the first portion 1121 is wider in the second direction X than the second portion 1122.

In some embodiments, the cell base 100 may be an interdigitated back contact (IBC) cell, a hybrid passivated back contact (HPBC) cell, a TBC cell combining tunnel oxide passivated contact (TOPCon) technology and IBC technology, or an HBC cell combining heterojunction (HIT/HJT) technology and IBC technology. Of course, it may also be other types of back contact cells.

The cell base 100 includes: a substrate having a first surface and a second surface opposing each other. The first surface has a textured structure which can increase internal reflection of incident light, thereby reducing optical losses and enhancing the photoelectric conversion efficiency of the cell. The first surface has a front surface field (FSF), where the conductivity type of the doping elements of the FSF is identical to that of the substrate. FSF utilizes the field passivation effect to reduce the concentration of minority carriers of the surface, thereby decreasing the surface recombination velocity, reducing the series resistance and improving the electron transport capability. The first surface includes a first passivation layer and a first antireflection layer. The first passivation layer is located on the surface of the FSF, and the first antireflection layer is located on the surface of the first passivation layer. The cell base 100 does not necessarily include the front surface field, the first passivation layer, or the first antireflection layer.

The second surface of the substrate has alternating I and II regions. The I regions are of a P-type or an N-type, and the II regions are of the other type. A gap region exists between adjacent P-type and N-type regions. Specifically, the first finger electrodes 101 are located in the I regions, and the second finger electrodes 102 are located in the II regions.

In some embodiments, there is no gap region between adjacent P-type and N-type regions. Instead, an insulating film layer is provided between adjacent P-type and N-type regions to achieve insulation therebetween, thereby achieving insulation between the first finger electrodes 101 and the second finger electrodes 102.

In some embodiments, the gap region is flush with the adjacent P-type and N-type regions, meaning no etching is performed on the substrate. Insulation between adjacent P-type and N-type regions is achieved through an isolating film layer. The isolating film layer may be a passivation layer or intrinsic semiconductor layer.

In some embodiments, the gap region is lower than the adjacent P-type region and also lower than the adjacent N-type region. That is, the gap region has a trench recessed from the second surface towards the first surface. This trench is configured to automatically isolate regions of different conductivity types, eliminating the leakage caused by the formation of a PN junction between heavily doped P-type and N-type regions in IBC cells and further improving cell efficiency.

In some embodiments, the surface of the gap region may be a polished surface or a textured surface.

In some embodiments, the P-type regions and the N-type regions respectively have a tunneling silicon oxide layer and a doped polysilicon layer, where the P regions have a P-type doped polysilicon layer, and the N regions have an N-type doped polysilicon layer. In some embodiments, the P-type regions and the N-type regions respectively have an intrinsic amorphous silicon layer, a doped amorphous silicon layer, and a transparent conductive layer, where the P-type regions have a P-type doped amorphous silicon layer, and the N-type regions have an N-type doped amorphous silicon layer.

In some embodiments, a second passivation layer and a second antireflection layer are provided on the P-type regions, N-type regions, and gap regions, where the first finger electrodes 101 and the second finger electrodes 102 are located on the second antireflection layer.

In some embodiments, the cell base 100 has a first edge 11, a second edge 12 positioned opposite to the first edge 11, and two third edges (not shown) connecting the first edge 11 and the second edge 12. The junctions between the first edge 11 and the third edges and the junctions between the second edge and the third edge have chamfers. Provision of these chamfers is because that in conventional solar cells, due to the limitations of the refining process of monocrystalline silicon for preparing the substrate, monocrystalline silicon rods can only be made round at present. After the silicon rods are produced, they are sliced to form monocrystalline silicon wafers (the area of the wafer is intentionally designed to maximize the light-receiving area, while also maximizing the conservation of silicon rod material and facilitating the production of cell bases and components). Chamfers are generally provided at the junctions of edges of the substrate to reduce the external stress on the silicon wafers and avoid micro-damage to the edges and corners of the silicon wafers.

In some embodiments, if the sum of the first connection electrodes 111 and the second connection electrodes 112 is even, referring to FIG. 1, the conductivity type of the second edge connection electrode corresponding to the second edge 12 of the substrate is the same as that of the second connection electrode 112. Then, the first connection electrode 111 adjacent to the second edge connection electrode is designed similarly to the aforementioned second connection electrode 112, that is, the second edge connection electrode passes through a spacing portion of the first connection electrode 111 and connects with the adjacent second connection electrode 112.

In some embodiments, if the sum of the first connection electrodes and the second connection electrodes is odd, the conductivity type of the second edge connection electrode corresponding to the second edge of the substrate is the same as that of the first connection electrode. Then, the second edge connection electrode has the same configuration as the aforementioned edge connection electrode, and the second connection electrode adjacent to the second edge connection electrode is designed similarly to the aforementioned second connection electrode.

No soldering portion is provided on the edge connection electrode 103 adjacent to the first edge 11, which can avoid the issue of damage to the edges of the cell base caused by stress from the solder ribbons.

Provision of the connection structure 110 for connecting the edge connection electrode 103 with the first connection electrode 111 adjacent to the edge connection electrode 103 can improve the collection rate of current generated by the substrate at the first edge 11 and can also reduce the defect rate of the cell.

In some embodiments, the material of the connection structure 110 is the same as that of the first finger electrode 101. The paste used for the connection structure 110 is the same as that for the first finger electrode 101. That is, the connection structure 110 is made of a fire-through paste. The connection structure 110 penetrates through the passivation layer and forms an electrical contact with the corresponding collection film layer. In this way, the connection structure 110 not only enables current conduction between the edge connection electrode 103 and the adjacent first connection electrode 111, but also collects current on the substrate surface by itself, thereby increasing the collection path and improving the efficiency of current collection.

In some embodiments, the paste for the connection structure 110 is the same as that for the busbar. That is, the connection structure 110 is made of a non-fire-through paste. The connection structure 110 is located on the surface of the passivation layer. In this way, there is no need to design a complex layout for I regions and II regions on the substrate surface below the connection structure 110 to prevent electrical contact between the connection structure 110 and the doped region of another polarity, and to prevent the resulting short circuits. In addition, the connection structure 110 can avoid damaging the passivation layer, thus ensuring the integrity of the passivation layer. This improves the passivation effect of the passivation layer on the substrate, which is beneficial for reducing the optical loss of solar cells and enhancing the photoelectric conversion efficiency of solar cells. In addition, since non-fire-through paste does not contain excessive glass powder that can damage the PN junction, it can effectively reduce metal recombination, enhance the open-circuit voltage of solar cells, and improve the conversion efficiency of solar cells.

Conventional paste includes a mixture of metal powder, glass powder, and organic vehicle. Non-fire-through paste refers to a paste containing a lower amount of glass powder than conventional paste. During the sintering process, it has weak firs-through capability and does not require to or cannot fire through the passivation layer. Fire-through paste refers to a paste with strong fire-through capability that can fire through the passivation layer during the sintering process.

In some embodiments, the connection structure 110 may be a film layer or conductive wire with conductive materials, as long as it achieves the electrical connection between the edge connection electrode 103 and the adjacent first connection electrode 111.

At least one of the two adjacent collection portions includes a first portion 1121 adjacent to the connection structure 110 and a second portion 1122 away from the connection structure 110, and the first portion 1121 is wider in the second direction X than the second portion 1122. Specifically, an end portion of a busbar connection electrode having opposite polarity to the connection structure 110 is widened to improve the welding tensile strength between the solder ribbon and the cell base, thus avoiding issues such as incomplete solder and poor solder quality.

In some embodiments, referring to FIG. 2, a spacing d between the second finger electrode 102 adjacent to the connection structure 110 and the connection structure 110, and a length L of the first portion 1121 along the first direction Y satisfy: d≤L≤2d. This proportional relationship can improve solder quality, further reducing contact resistance and improving cell efficiency, and can also decrease the amount of second connection electrodes 112, thus lowering costs.

In some embodiments, the length L of the first portion 1121 along the first direction Y ranges from 0.5 mm to 2 mm.

The length L of the first portion 1121 along the first direction Y may range from 0.5 mm to 1 mm, 1 mm to 1.5 mm, or 1.5 mm to 2 mm. The length L of the first portion 1121 along the first direction Y may be 0.5 mm, 0.7 mm, 1.1 mm, 1.3 mm, 1.5 mm, 1.7 mm, or 2 mm.

In some embodiments, the spacing d between the second finger electrode 102 adjacent to the connection structure 110 and the connection structure 110 ranges from 0.3 mm to 1.5 mm.

The spacing d between the second finger electrode 102 adjacent to the connection structure 110 and the connection structure 110 may range from 0.3 mm to 0.6 mm, 0.6 mm to 1.1 mm, or 1.1 mm to 1.5 mm. The spacing d between the second finger electrode 102 adjacent to the connection structure 110 and the connection structure 110 may be 0.3 mm, 0.5 mm, 0.7 mm, 1.1 mm, 1.3 mm, or 1.5 mm.

In some embodiments, the spacing d between the second finger electrode 102 adjacent to the connection structure 110 and the connection structure 110 is greater than or equal to the spacing between the adjacent first finger electrode 101 and second finger electrode 102.

In some embodiments, the width of the connection structure 110 is greater than or equal to the width of the first finger electrode 101. A larger width of the connection structure 110 can enhance the efficiency of carrier collection, reduce contact resistance, and subsequently reduce the electrical losses of the solar cell, thereby improving the photoelectric conversion efficiency of the solar cell.

In some embodiments, the number of the connection structures 110 ranges from 5 to 24. The number of the connection structures 110 can shorten the path for the current collected by the edge connection electrode 103 to reach the adjacent first connection electrode 111, which means the path length from each edge region to the second connection electrode 112 can be reduced, thereby reducing path loss.

In some embodiments, the number of the connection structures 110 may range from 5 to 8, 8 to 10, 10 to 13, 13 to 15, 15 to 18, 18 to 21, or 21 to 24. The number of the connection structures 110 may be 5, 7, 9, 12, 14, 17, 19, 22, or 23.

In some embodiments, the number of the second finger electrodes 102 located between adjacent connection structures 110 ranges from 6 to 12. By limiting the range of the number of the second finger electrodes 102 located between adjacent connection structures 110, the distance between adjacent connection structures 110 is controlled. This, under the premise of satisfying the shortest path, reduces the impact on the second connection electrodes 112, thereby reducing the soldering impact between the second connection electrodes 112 and the solder ribbons, and thus achieving a balance between the yield rate and the photoelectric conversion efficiency of the cells.

The number of the second finger electrodes 102 located between adjacent connection structures 110 may range from 6 to 8, 8 to 10, or 10 to 12. The number of the second finger electrodes 102 located between adjacent connection structures 110 may be 7, 9, 10, or 11.

In some embodiments, referring to FIG. 3, the width W1 of the first portion 1121 along the second direction X ranges from 50 μm to 100 μm. When the width W1 of the first portion 1121 along the second direction X falls within the aforementioned range, the width of the first portion 1121 is relatively large, so that the solder ribbon can be easily aligned with the first portion 1121. Consequently, the contact area between the solder ribbon and the first portion 1121 is relatively large, which can avoid issues such as incomplete solder and high contact resistance caused by a small soldering area. This, in turn, can improve the yield rate of photovoltaic modules.

The width W1 of the first portion 1121 along the second direction X may range from 50 μm to 60 μm, 60 μm to 70 μm, 70 μm to 80 μm, 80 μm to 90 μm, or 90 μm to 100 μm. The width W1 of the first portion 1121 along the second direction X may be 52 μm, 55 μm, 57 μm, 59 μm, 62 μm, 64 μm, 68 μm, 71 μm, 74 μm, 78 μm, 83 μm, 86 μm, 89 μm, 94 μm, 96 μm, or 99 μm.

Referring to FIG. 3, the width W2 of the second portion 1122 along the second direction X ranges from 10 μm to 50 μm.

The width W2 of the second portion 1122 along the second direction X may range from 10 μm to 20 μm, 20 μm to 30 μm, 30 μm to 40 μm, or 40 μm to 50 μm. The width W2 of the second portion 1122 along the second direction X may be 12 μm, 15 μm, 17 μm, 19 μm, 22 μm, 24 μm, 28 μm, 31 μm, 34 μm, 38 μm, 43 μm, 46 μm, 49 μm, or 50 μm.

Referring to FIG. 3, the width W3 of the second finger electrode 102 along the first direction Y ranges from 20 μm to 100 μm.

The width W3 of the second finger electrode 102 along the first direction Y may range from 20 μm to 40 μm, 40 μm to 60 μm, 60 μm to 70 μm, 70 μm to 90 μm, or 90 μm to 100 μm. The width W3 of the second finger electrode 102 along the first direction Y may be 22 μm, 29 μm, 37 μm, 42 μm, 49 μm, 54 μm, 58 μm, 63 μm, 69 μm, 72 μm, 79 μm, 83 μm, 89 μm, 94 μm, 96 μm, or 99 μm.

In some embodiments, the spacing between the edge connection electrode 103 and the adjacent second connection electrode 112 is first spacing S1 (not shown in the figure), and the first spacing S1 is less than or equal to a second spacing S2 between the adjacent first connection electrode 111 and second connection electrode 112. In this way, the first spacing between the edge connection electrode 103 and the adjacent second connection electrode 112 is appropriate. In a layout that does not waste the shielding area of the edge connection electrode 103, the second connection electrode 112, and the first connection electrode 111, the layout between the edge connection electrode 103 and the adjacent first connection electrode 111 can achieve the minimum migration distance and loss of carriers on the substrate, thereby improving the open-circuit voltage of the solar cell.

It should be noted that the first spacing refers to the spacing between the axis of the edge connection electrode and the axis of the adjacent second connection electrode. Embodiments of the present disclosure do not limit the specific meaning of the first spacing. For example, the first spacing may also be the distance between the side of the edge connection electrode close to the first edge and the side of the adjacent second connection electrode far from the first edge, or the shortest distance between the edge connection electrode and the adjacent second connection electrode.

In some embodiments, the first spacing S1 ranges from 0.2 mm to 0.7 mm. The first spacing S1 may range from 0.2 mm to 0.35 mm, 0.35 mm to 0.46 mm, 0.46 mm to 0.58 mm, 0.58 mm to 0.63 mm, or 0.63 mm to 0.7 mm.

In some embodiments, the second spacing S2 (not shown in the figure) between the adjacent first connection electrode 111 and second connection electrode 112 ranges from 0.3 mm to 0.8 mm. The second spacing S2 between the adjacent first connection electrode 111 and second connection electrode 112 ranges from 0.3 mm to 0.35 mm, 0.35 mm to 0.43 mm, 0.43 mm to 0.5 mm, 0.5 mm to 0.58 mm, 0.58 mm to 0.66 mm, 0.66 mm to 0.72 mm, or 0.72 mm to 0.8 mm.

The solar cell provided in embodiments of the present disclosure includes first finger electrodes 101, second finger electrodes 102, first connection electrodes 111 and second connection electrodes 112. The first connection electrodes 111 are connected to the first finger electrodes 101, and the second connection electrodes 112 are connected to the second finger electrodes 102. The first connection electrodes 111 include an edge connection electrode 103 adjacent to the first edge 11, and no soldering portion is provided on the edge connection electrode 103. One end of the connection structure 110 is connected to the first connection electrodes 111, and the other end of the connection structure 110 passes through the spacing portion 104 and is connected to a respective one of the first connection electrodes 111 adjacent to the edge connection electrode 103. Such configuration can avoid the problem of cracking at the edge of the cell base. The connection structure 110 can collect carriers at the edge and improve cell efficiency. At least one of the two adjacent collection portions includes a first portion 1121 adjacent to the connection structure 110 and a second portion 1122 away from the connection structure 110, and the first portion 1121 is wider in the second direction X than the second portion 1122. Specifically, an end portion of a busbar connection electrode having opposite polarity to the connection structure 110 is widened to improve the welding tensile strength between the solder ribbon and the cell base, thus avoiding issues such as incomplete solder and poor solder quality.

Correspondingly, another embodiment of the present disclosure further provides a solar cell. Different from the previous embodiments, the first finger electrodes of the solar cell provided in this embodiment include a first confluence portion and a first collection portion. The width of the first confluence portion is greater than that of the first collection portion. The second finger electrodes include a second confluence portion and a second collection portion. The width of the second confluence portion is greater than that of the second collection portion. The first confluence portion serves as a soldering portion of the first finger electrodes, and the second confluence portion serves as a soldering portion of the second finger electrodes. The parts that are the same as those in the previous embodiment are not described in detail here.

Figure 4:
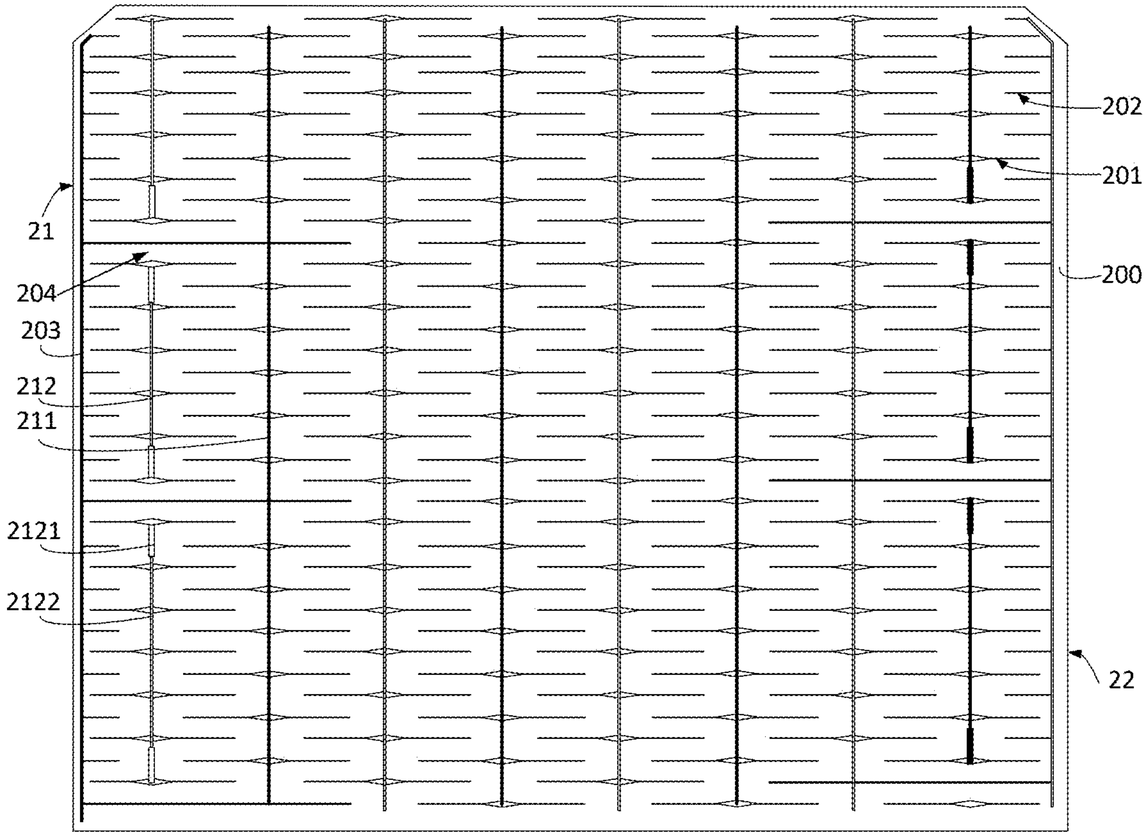
FIG. 4 is a schematic structural view of the back contact cell provided in another embodiment of the present disclosure.
Figure 5:
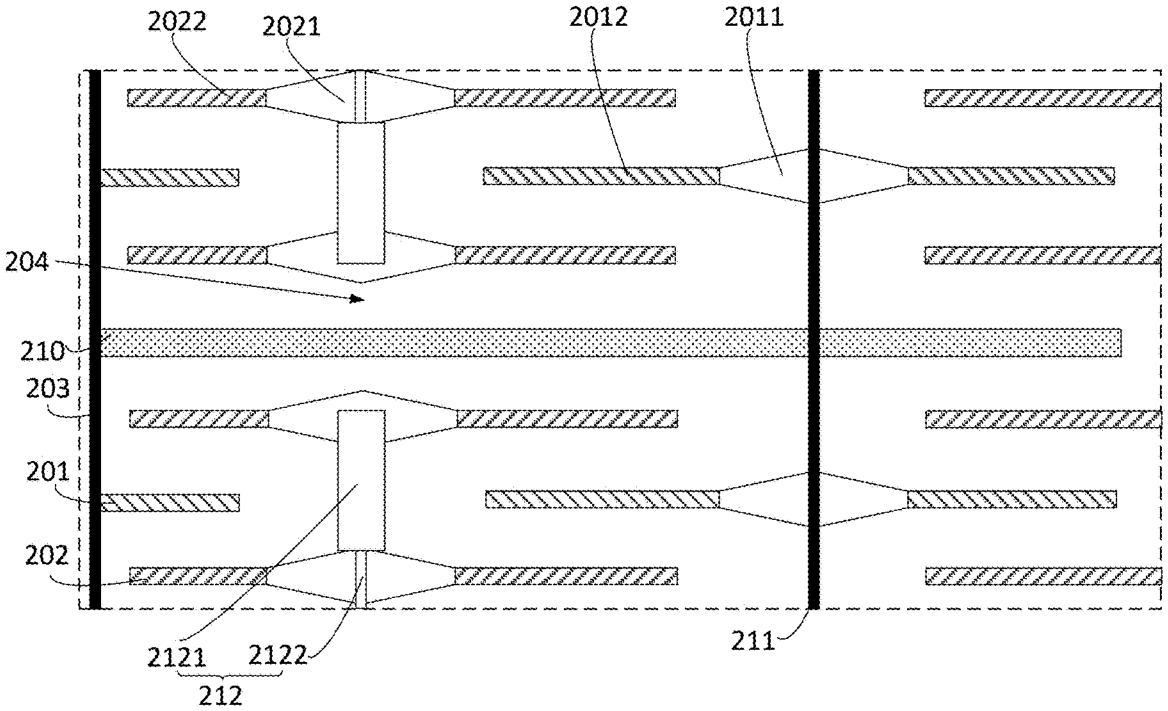
FIG. 5 is a partially enlarged view of the back contact cell in FIG. 4.

FIG. 4 is a schematic structural view of the solar cell provided in another embodiment of the present disclosure; FIG. 5 is a partially enlarged view of the solar cell in FIG. 4.

Referring to FIG. 4 and FIG. 5, the solar cell includes: a cell base 200, having a first edge 21; first finger electrodes 201 and second finger electrodes 202 alternatingly arranged along a first direction Y; first connection electrodes 211 and second connection electrodes 212 alternatingly arranged along a second direction X, the first connection electrodes 211 being connected to the first finger electrodes 201, and the second connection electrodes 212 being connected to the second finger electrodes 202; where the first connection electrodes 211 include an edge connection electrode 203 adjacent to the first edge 21, and no soldering portion is provided on the edge connection electrode 203; a second connection electrode 212 immediately adjacent to the first edge 21 includes separate connection portions, where at least one collection portion is connected to one or more respective second finger electrodes 202 of the second finger electrodes 202; a connection structure 210, where the connection structure 210 is connected at one end to the edge connection electrode 203, extends through a space between two adjacent collection portions of the second connection electrode 212 immediately adjacent to the edge connection electrode 203, and is connected at another end to one of the first connection electrodes 211 adjacent to the edge connection electrode 203; where at least one of the two adjacent collection portions includes a first portion 2121 adjacent to the connection structure 210 and a second portion 2122 away from the connection structure 210, and the first portion 2121 is wider in the second direction X than the second portion 2122.

In some embodiments, the first finger electrodes 201 include a first collection portion 2012 and a first confluence portion 2011, the first confluence portion 2011 is connected to a respective one of the first connection electrodes 211, and the first confluence portion 2011 serves as a soldering portion of the first finger electrodes 201; the first confluence portion 2011 is wider in the first direction Y than the first collection portion 2012. Increasing the soldering area between the first finger electrodes 201 and the solder ribbon by means of the first confluence portion 2011 can avoid the issues of finger electrode melting caused by excessively thin first finger electrodes 201 and poor soldering quality caused by small soldering area, thereby improving the yield rate of photovoltaic modules.

In some embodiments, the second finger electrodes 202 include a second collection portion 2022 and a second confluence portion 2021, the second confluence portion 2021 is connected to a respective one of the second connection electrodes 212, and the second confluence portion 2021 serves as a soldering portion of the second finger electrodes 202; the second confluence portion 2021 is wider in the first direction Y than the second collection portion 2022. Increasing the soldering area between the second finger electrodes 202 and the solder ribbon by means of the second confluence portion 2021 can avoid the issues of finger electrode melting caused by excessively thin second finger electrodes 202 and poor soldering quality caused by small soldering area, thereby improving the yield rate of photovoltaic modules. Further, the second confluence portion 2021 with a large area can also avoid the issue of incomplete solder between the second finger electrode 202 adjacent to the connection structure 210 and the solder ribbon caused by the insulation issue of the connection structure 210, thereby further improving the yield rate of photovoltaic modules.

In some embodiments, the second confluence portion 2021 may be diamond-shaped, rectangular, square, hexagonal, or octagonal. The first confluence portion 2011 may be diamond-shaped, rectangular, square, hexagonal, or octagonal.

In some embodiments, a width of the first confluence portion 2011 ranges from 10 μm to 50 μm.

In some embodiments, the width of the second confluence portion 2021 ranges from 20 μm to 100 μm.

A spacing d between the second finger electrode 202 adjacent to the connection structure 210 and the connection structure 210, and a length L of the first portion 2121 along the first direction Y satisfy: $d \leq L \leq 2d$. The length L of the first portion 2121 along the first direction Y ranges from 0.5 mm to 2 mm.

In some embodiments, the spacing d between the second finger electrode 202 adjacent to the connection structure 210 and the connection structure 210 ranges from 0.3 mm to 1.5 mm.

In some embodiments, the spacing d between the second finger electrode 202 adjacent to the connection structure 210 and the connection structure 210 is greater than or equal to the spacing between the adjacent first finger electrode 201 and second finger electrode 202.

In some embodiments, the width of the connection structure 210 is greater than or equal to the width of the first finger electrode 201.

In some embodiments, the number of the connection structures 210 ranges from 5 to 24.

In some embodiments, the number of the second finger electrodes 202 located between adjacent connection structures 210 ranges from 6 to 12.

It should be noted that in another embodiment, the cell base 200, the first connection electrodes 211, the second connection electrodes 212, the edge connection electrode, the second edge 22, the second edge connection electrode, and the connection structure 210 refer to the cell base 100, the first connection electrodes 111, the second connection electrodes 112, the edge connection electrode, the second edge 12, the second edge connection electrode, and the connection structure 110 of the previous embodiment.

Correspondingly, another embodiment of the present disclosure further provides a solar cell. Different from the previous embodiments, the first finger electrodes of the solar cell provided in this embodiment include first solder pads, and the second finger electrodes include second solder pads. The first solder pads serve as soldering portions of the first finger electrodes, and the second solder pads serve as soldering portions of the second finger electrodes. The parts that are the same as those in the previous embodiment are not described in detail here.

Figure 6:
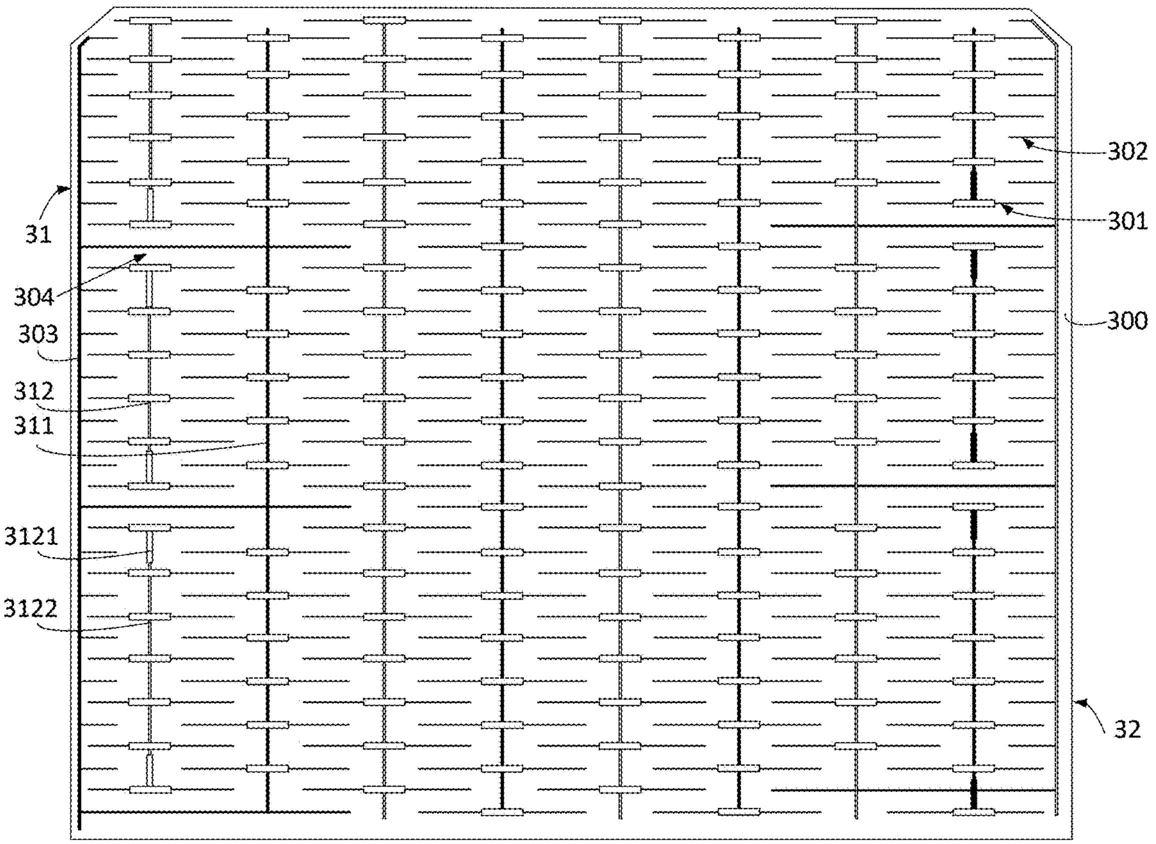
FIG. 6 is a schematic structural view of the back contact cell provided in yet another embodiment of the present disclosure.
Figure 7:
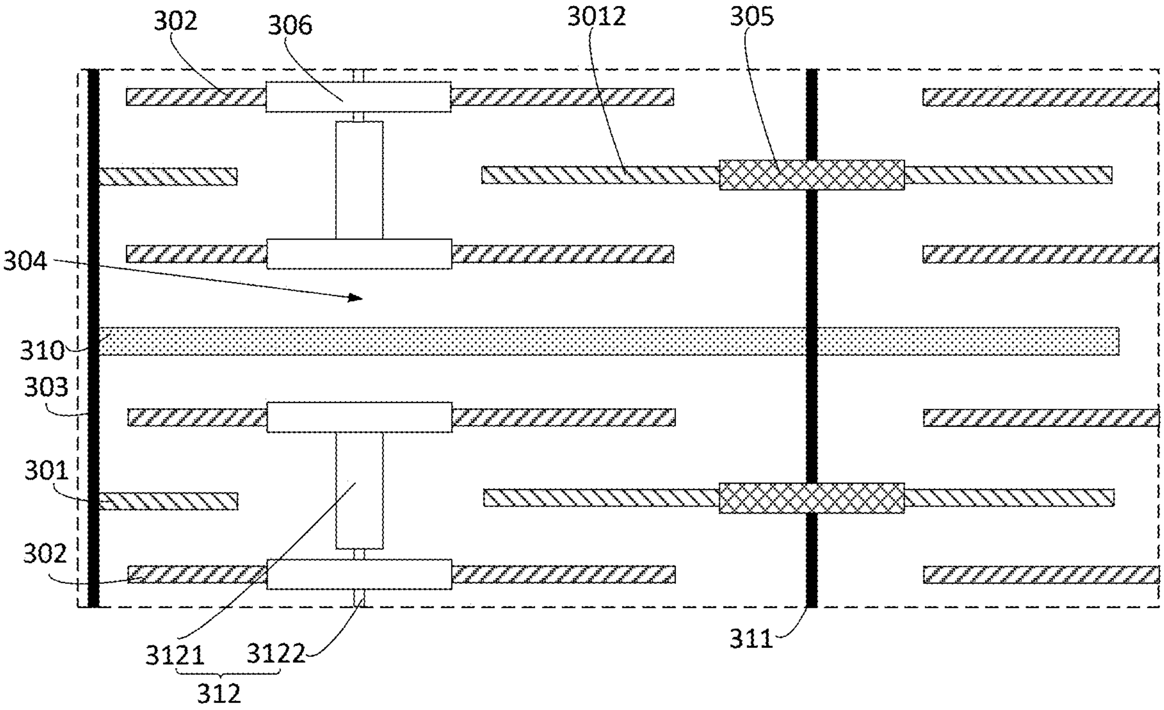
FIG. 7 is a partially enlarged view of the back contact cell in FIG. 6.

FIG. 6 is a schematic structural view of the solar cell provided in another embodiment of the present disclosure; FIG. 7 is a partially enlarged view of the solar cell in FIG. 6.

Referring to FIG. 6 and FIG. 7, the solar cell includes: a cell base 300, having a first edge 31; first finger electrodes 301 and second finger electrodes 302 alternatingly arranged along a first direction Y; first connection electrodes 311 and second connection electrodes 312 alternatingly arranged along a second direction X, the first connection electrodes 311 being connected to the first finger electrodes 301, and the second connection electrodes 312 being connected to the second finger electrodes 302; where the first connection electrodes 311 include an edge connection electrode 303 adjacent to the first edge 31, and no soldering portion is provided on the edge connection electrode 303; a second connection electrode 312 immediately adjacent to the first edge 31 includes separate connection portions, where at least one collection portion is connected to one or more respective second finger electrodes 302 of the second finger electrodes 302; a connection structure 310, where the connection structure 310 is connected at one end to the edge connection electrode 303, extends through a space between two adjacent collection portions of the second connection electrode 312 immediately adjacent to the edge connection electrode 303, and is connected at another end to one of the first connection electrodes 311 adjacent to the edge connection electrode 303; where at least one of the two adjacent collection portions includes a first portion 3121 adjacent to the connection structure 310 and a second portion 3122 away from the connection structure 310, and the first portion 3121 is wider in the second direction X than the second portion 3122.

In some embodiments, the solar cell further includes solder pads located at intersections of some of the second connection electrodes 312 and the second finger electrodes 302. The solder pads are also located at the intersection of some of the first connection electrodes 311 and the first finger electrodes 301. The solder pads located at the intersections of the first connection electrodes 311 and the first finger electrodes 301 serve as first solder pads 305, and the solder pads located at the intersections of the second connection electrodes 312 and the second finger electrodes 302 serve as second solder pads 306.

A spacing d between the second finger electrode 302 adjacent to the connection structure 310 and the connection structure 310, and a length L of the first portion 3121 along the first direction Y satisfy: $d \le L \le 2d$. The length L of the first portion 3121 along the first direction Y ranges from 0.5 mm to 2 mm.

In some embodiments, the spacing d between the second finger electrode 302 adjacent to the connection structure 310 and the connection structure 310 ranges from 0.3 mm to 1.5 mm.

In some embodiments, the spacing d between the second finger electrode 302 adjacent to the connection structure 310 and the connection structure 310 is greater than or equal to the spacing between the adjacent first finger electrode 301 and second finger electrode 302.

In some embodiments, the width of the connection structure 310 is greater than or equal to the width of the first finger electrode 301.

In some embodiments, the number of the connection structures 310 ranges from 5 to 24.

In some embodiments, the number of the second finger electrodes 302 located between adjacent connection structures 310 ranges from 6 to 12.

It should be noted that in another embodiment, the cell base 300, the first connection electrodes 311, the second connection electrodes 312, the edge connection electrode 303, the second edge 32, the connection structure 310, the first finger electrodes 301, and the second finger electrodes 302 refer to the cell base 100, the first connection electrodes 111, the second connection electrodes 112, the edge connection electrode 103, the second edge 12, the connection structure 102, the first finger electrodes 101, and the second finger electrodes 102 of the previous embodiment.

Figure 8:
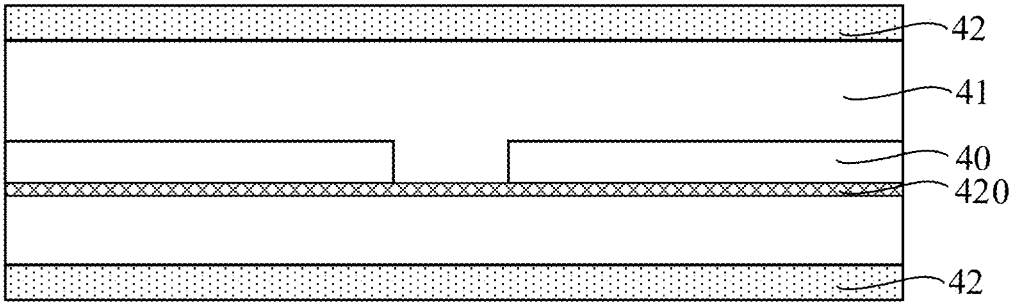
FIG. 8 is a schematic structural view of a photovoltaic module provided in an embodiment of the present disclosure.
Figure 9:
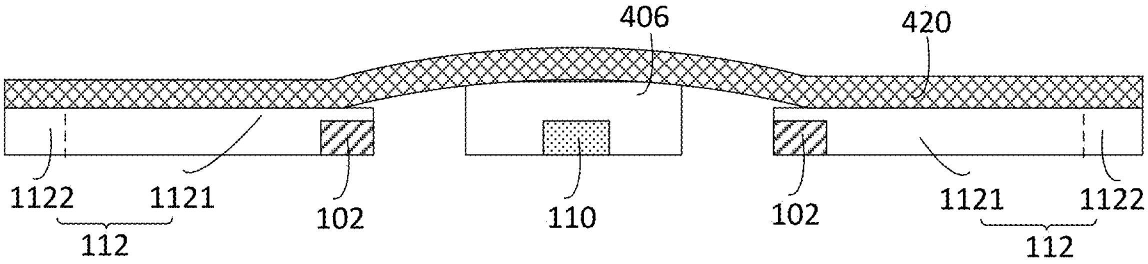
FIG. 9 is a partial cross-sectional view of the photovoltaic module provided in an embodiment of the present disclosure.
Figure 10:
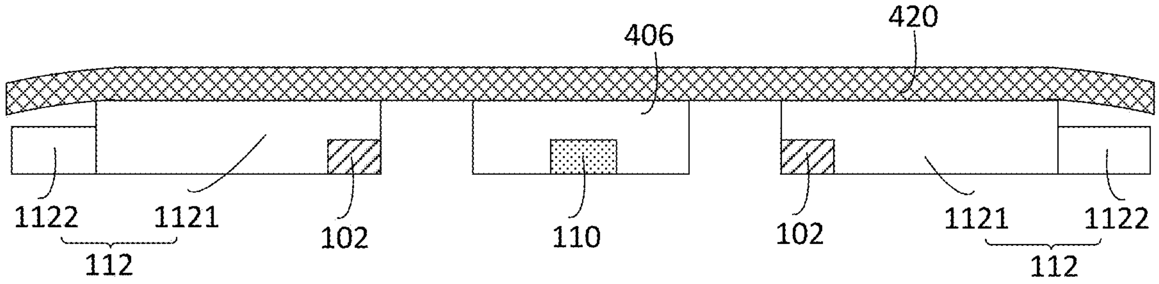
FIG. 10 is a partial cross-sectional view of the photovoltaic module provided in another embodiment of the present disclosure.

FIG. 8 is a schematic structural view of a photovoltaic module provided in an embodiment of the present disclosure; FIG. 9 is a partial cross-sectional view of the photovoltaic module provided in an embodiment of the present disclosure; and FIG. 10 is a partial cross-sectional view of the photovoltaic module provided in another embodiment of the present disclosure.

Correspondingly, referring to FIG. 8, some embodiments of the present disclosure further provide a photovoltaic module, including: at least one cell string, formed by connecting multiple solar cells 40 as described above; at least one encapsulation film 41, configured for covering the at least one cell string; and at least one cover plate 42, located on a side of the at least one encapsulation film 41 away from the at least one cell string.

In some embodiments, referring to FIG. 8 and FIG. 9, the cell string includes: solar cells; solder ribbons, electrically connected to the second connection electrodes; and an insulating layer, located between the connection structure and the solder ribbons.

In some embodiments, multiple cell strings and multiple cell bases may be electrically connected through solder ribbons 420, with the solder ribbons 420 welded to the soldering portions on the cell bases. For example, one end of the solder ribbon 420 is electrically connected to a soldering portion of the first finger electrode of the first cell base, and the other end of the solder ribbon 420 is electrically connected to a soldering portion of the second finger electrode of the adjacent second cell base.

In some embodiments, there is no gap provided between adjacent cell bases, that is, the cell bases overlap one another.

In some embodiments, the insulating layer 406 covers a portion of the surface of the solar cell 40. For instance, the insulating layer 406 covers the area between the solder ribbon connected to the first connection electrode and the second finger electrode, and covers the area adjacent to an end surface of the solder ribbon connected to the first connection electrode facing the second finger electrode, to provide electrical insulation between the solder ribbon connected to the first connection electrode and the second finger electrode. Similarly, the insulating layer 406 also covers the area between the solder ribbon connected to the second connection electrode and the first finger electrode, covers the area adjacent to an end surface of the solder ribbon connected to the second connection electrode facing the first finger electrode, and covers the area between the connection structure and the solder ribbon connected to the second connection electrode, to provide electrical insulation between the solder ribbon connected to the second connection electrode and the first finger electrode, as well as insulation between the solder ribbon connected to the second connection electrode and the connection structure.

Referring to FIG. 9, the first portion is flush with the second portion, and the top surface of the insulating layer away from the connection structure is higher than the top surface of the first portion. The solder ribbon is lifted by the insulating layer by a certain height, but the widened design of the first portion increases the soldering area between the second connection electrode and the solder ribbon.

Referring to FIG. 10, a top surface, away from the cell base, of the first portion of the second connection electrode is flush with a top surface, away from the connection structure, of the insulating layer.

In some embodiments, the encapsulation film 41 includes a first encapsulation film and a second encapsulation film. The first encapsulation film covers one of the front surface and the back surface of the solar cell, while the second encapsulation film covers the other. Specifically, at least one of the first encapsulation film and the second encapsulation film may be an organic encapsulation film such as polyvinyl butyral (PVB) film, ethylene-vinyl acetate copolymer (EVA) film, polyethylene octene elastomer (POE) film, or polyethylene terephthalate (PET) film.

It will be appreciated that the first encapsulation film and the second encapsulation film have a boundary before lamination. After the lamination process, the boundary between the first encapsulation film and the second encapsulation film of the photovoltaic module no longer exists, as the first encapsulation film and the second encapsulation film have become an integral encapsulation film 41.

In some embodiments, the cover plate 42 may be a glass cover plate, a plastic cover plate, or any other cover plate with a light-transmitting function. Specifically, a surface, facing towards the encapsulation film 41, of the cover plate 42 may be uneven, thereby enhancing the utilization rate of incident light. The cover plate 42 includes a first cover plate and a second cover plate. The first cover plate opposes the first encapsulation film, and the second cover plate opposes the second encapsulation film. Alternatively, the first cover plate opposes one side of the solar cell, and the second cover plate opposes the other side of the solar cell.

Those of ordinary skill in the art can understand that the aforementioned embodiments are specific examples for implementing the present disclosure. In practical applications, various modifications can be made to them in form and detail without deviating from the scope of the present disclosure. A person skilled in the art may make various alterations and modifications without departing from the scope of the present disclosure, and thus the scope of protection of the present disclosure should be determined by the scope of the appended claims.

What is claimed is:

1. A back contact cell, comprising:

a cell base having a first edge;

first finger electrodes and second finger electrodes alternatingly arranged along a first direction;

first connection electrodes and second connection electrodes alternatingly arranged along a second direction, the first connection electrodes being connected to the first finger electrodes, and the second connection electrodes being connected to the second finger electrodes;

wherein the first connection electrodes include an edge connection electrode adjacent to the first edge, and no soldering portion is provided on the edge connection electrode; a second connection electrode immediately adjacent to the first edge includes separate collection portions, wherein at least one collection portion is connected to one or more respective second finger electrodes of the second finger electrodes; and a connection structure, wherein the connection structure is connected at one end to the edge connection electrode, extends through a space between two adjacent collection portions of the second connection electrode immediately adjacent to the edge connection electrode, and is connected at another end to one of the first connection electrodes adjacent to the edge connection electrode;

wherein at least one of the two adjacent collection portions includes a first portion adjacent to the connection structure and a second portion away from the connection structure, and the first portion is wider in the second direction than the second portion.

2. The back contact cell according to claim 1, wherein a spacing d between the second finger electrode adjacent to the connection structure and the connection structure, and a length L of the first portion along the first direction satisfy: $d \leq L \leq 2d$.

3. The back contact cell according to claim 2, wherein the length L of the first portion along the first direction ranges from 0.5 mm to 2 mm.

4. The back contact cell according to claim 1, wherein the second finger electrodes include a second collection portion and a second confluence portion, the second confluence portion is connected to a respective one of the second connection electrodes, and the second confluence portion serves as a soldering portion of the second finger electrodes; the second confluence portion is wider in the first direction than the second collection portion.

5. The back contact cell according to claim 2, wherein the second finger electrodes include a second collection portion and a second confluence portion, the second confluence portion is connected to a respective one of the second connection electrodes, and the second confluence portion serves as a soldering portion of the second finger electrodes; the second confluence portion is wider in the first direction than the second collection portion.

6. The back contact cell according to claim 1, further comprising solder pads located at intersections of some of the second connection electrodes and the second finger electrodes.

7. The back contact cell according to claim 2, further comprising solder pads located at intersections of some of the second connection electrodes and the second finger electrodes.

8. The back contact cell according to claim 1, wherein the number of the connection structures ranges from 5 to 24.

9. The back contact cell according to claim 1, wherein the number of the second finger electrodes located between adjacent connection structures ranges from 6 to 12.

10. The back contact cell according to claim 1, wherein a width of the first portion along the second direction ranges from 50 μm to 100 μm.

11. A photovoltaic module, comprising:

at least one cell string, formed by connecting a plurality of back contact cells, each of the plurality of back contact cells according to claim 1;

at least one encapsulation film, configured for covering the at least one cell string; and at least one cover plate, located on a side of the at least one encapsulation film away from the at least one cell string.

12. The photovoltaic module according to claim 11, wherein the at least one cell string includes:

back contact cells;

solder ribbons, electrically connected to the second connection electrodes; and an insulating layer, located between the connection structure and the solder ribbons; wherein a top surface, away from the cell base, of the first portion of the second connection electrodes is flush with a top surface, away from the connection structure, of the insulating layer.

13. The photovoltaic module according to claim 11, wherein a spacing d between the second finger electrode adjacent to the connection structure and the connection structure, and a length L of the first portion along the first direction satisfy: $d \leq L \leq 2d$.

14. The photovoltaic module according to claim 13, wherein the length L of the first portion along the first direction ranges from 0.5 mm to 2 mm.

15. The photovoltaic module according to claim 11, wherein the second finger electrodes include a second collection portion and a second confluence portion, the second confluence portion is connected to a respective one of the second connection electrodes, and the second confluence portion serves as a soldering portion of the second finger electrodes; the second confluence portion is wider in the first direction than the second collection portion.

16. The photovoltaic module according to claim 11, further comprising solder pads located at intersections of some of the second connection electrodes and the second finger electrodes.

17. The photovoltaic module according to claim 13, further comprising solder pads located at intersections of some of the second connection electrodes and the second finger electrodes.

18. The photovoltaic module according to claim 11, wherein the number of the connection structures ranges from 5 to 24.

19. The photovoltaic module according to claim 11, wherein the number of the second finger electrodes located between adjacent connection structures ranges from 6 to 12.

20. The photovoltaic module according to claim 11, wherein a width of the first portion along the second direction ranges from 50 μm to 100 μm.

* * * * *